(12) United States Patent
Chen et al.

(10) Patent No.: US 11,764,089 B2
(45) Date of Patent: Sep. 19, 2023

(54) SEMICONDUCTOR WAFER STORAGE DEVICE

(71) Applicant: Taiwan Semiconductor Manufacturing Co., Ltd., Hsinchu (TW)

(72) Inventors: Yu Ju- Chen, Taoyuan (TW); Ren-Hao Jheng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 17/228,337

(22) Filed: Apr. 12, 2021

(65) Prior Publication Data

US 2021/0257229 A1 Aug. 19, 2021

Related U.S. Application Data

(62) Division of application No. 16/456,118, filed on Jun. 28, 2019, now Pat. No. 10,978,326.

(60) Provisional application No. 62/752,271, filed on Oct. 29, 2018.

(51) Int. Cl.
*H01L 21/673* (2006.01)
*H01L 21/683* (2006.01)
*H01L 21/687* (2006.01)

(52) U.S. Cl.
CPC .... *H01L 21/6732* (2013.01); *H01L 21/67383* (2013.01); *H01L 21/67393* (2013.01); *H01L 21/6838* (2013.01); *H01L 21/68721* (2013.01)

(58) Field of Classification Search
CPC .......... H01L 21/6732; H01L 21/67383; H01L 21/67393; H01L 21/68; H01L 21/683; H01L 21/6838; H01L 21/687; H01L 21/68721

USPC ....................................................... 206/711
See application file for complete search history.

(56) References Cited

U.S. PATENT DOCUMENTS

| | | |
|---|---|---|
| 5,782,362 A | 7/1998 | Ohori |
| 6,446,948 B1 | 9/2002 | Allen |
| 7,500,564 B2 | 3/2009 | Choi |
| 8,863,956 B2 | 10/2014 | Brooks et al. |
| 9,558,984 B2 | 1/2017 | Oremus |
| 9,881,820 B2 | 1/2018 | Wong et al. |
| 9,881,826 B2 | 1/2018 | Maraschin et al. |
| 2006/0068524 A1 | 3/2006 | Yamamoto |
| 2006/0283774 A1 | 12/2006 | Hasegawa et al. |
| 2007/0063453 A1 | 3/2007 | Ishikawa et al. |

(Continued)

FOREIGN PATENT DOCUMENTS

| | | |
|---|---|---|
| CN | 1865096 A | 11/2006 |
| CN | 106941088 A | 7/2017 |

(Continued)

*Primary Examiner* — Bryon P Gehman

(74) *Attorney, Agent, or Firm* — Sterne, Kessler Goldstein & Fox P.L.L.C.

(57) ABSTRACT

The present disclosure describes a method for substrate storage. The method can include respectively placing a plurality of substrates into a plurality of slots formed by a plurality of fin structures on a panel of a storage device. The method can further include binding each of the plurality of substrates to an corresponding one of the plurality of fin structures. The method can further include moving the storage device from a first location to a second location. The method can further include un-binding the plurality of substrates from the plurality of fin structures.

20 Claims, 6 Drawing Sheets

(56) References Cited

U.S. PATENT DOCUMENTS

| | | | |
|---|---|---|---|
| 2016/0254172 A1 | 9/2016 | Adams et al. |
| 2017/0084477 A1 | 3/2017 | Kang et al. |
| 2017/0194180 A1 | 7/2017 | Tseng et al. |
| 2020/0135500 A1 | 4/2020 | Chen et al. |

FOREIGN PATENT DOCUMENTS

| | | |
|---|---|---|
| EP | 0579099 A1 | 1/1994 |
| KR | 10-2008-0090616 A | 10/2008 |

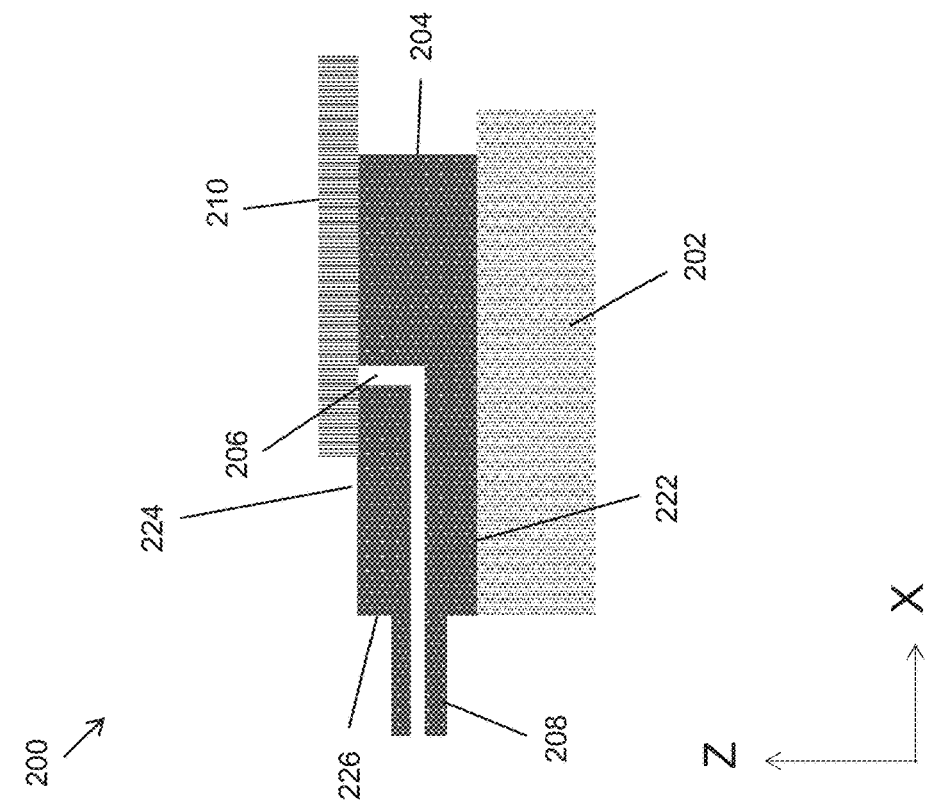
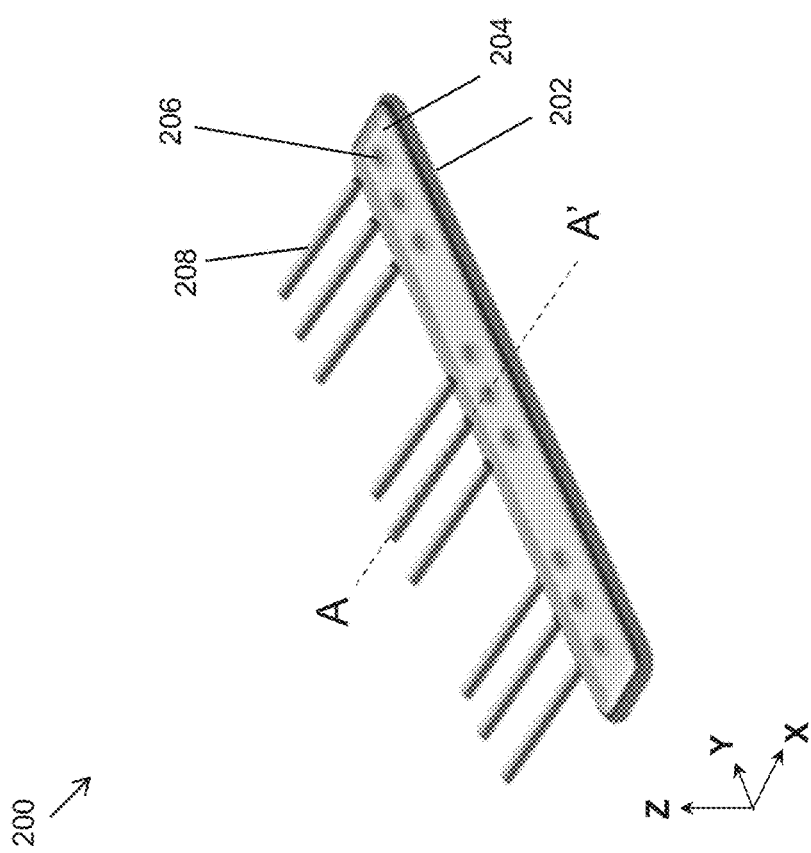
Fig. 2B
Fig. 2A

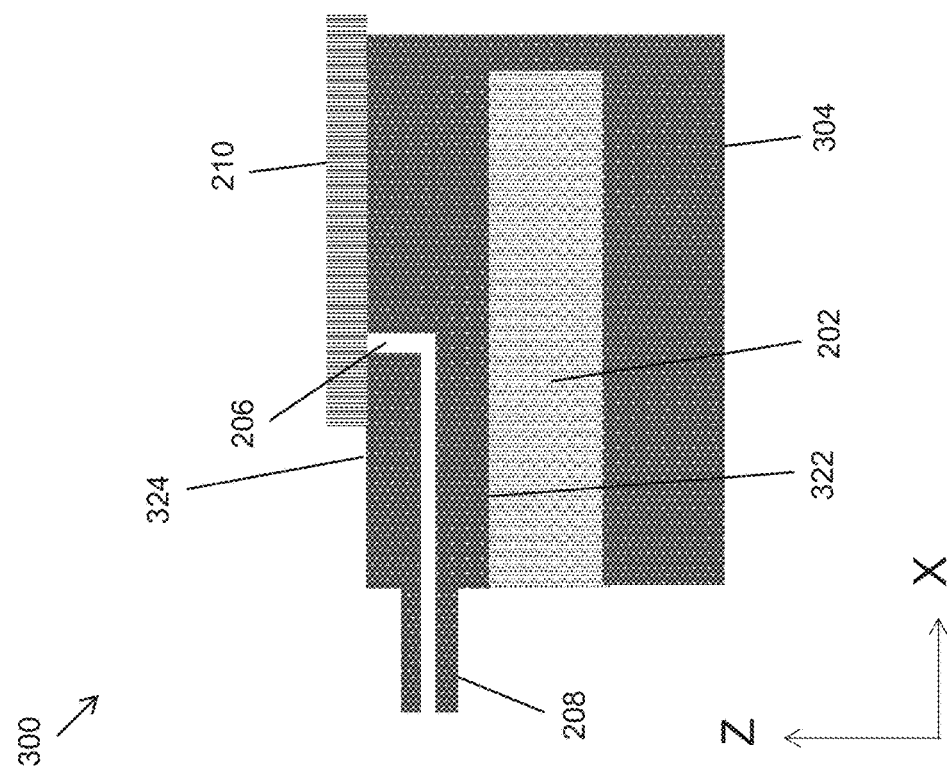
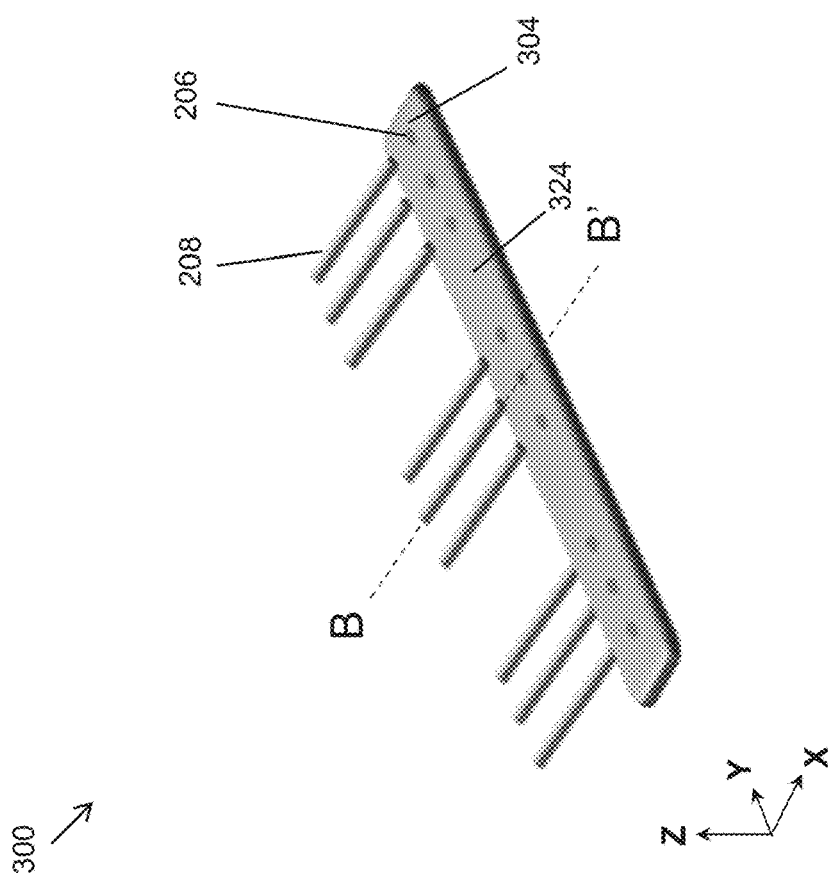
Fig. 3B
Fig. 3A

SEMICONDUCTOR WAFER STORAGE DEVICE

CROSS-REFERENCE TO RELATED APPLICATIONS

This application is a divisional application of U.S. non-Provisional patent application Ser. No. 16/456,118, titled "Semiconductor Water Storage Device," filed on Jun. 28, 2019, which claims the benefit of U.S. Provisional Patent Application No. 62/752,271, titled "Semiconductor Substrate Transport Apparatus and Method," filed on Oct. 29, 2018, the disclosures of which are incorporated by reference in their entireties.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for contamination control in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 2A illustrates an isometric view of a fin structure of a storage device, in accordance with some embodiments.

FIG. 2B illustrates a cross sectional view of a fin structure of a storage device, in accordance with some embodiments.

FIG. 3A illustrates an isometric view of a fin structure of a storage device, in accordance with some embodiments.

FIG. 3B illustrates a cross sectional view of a fin structure of a storage device, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
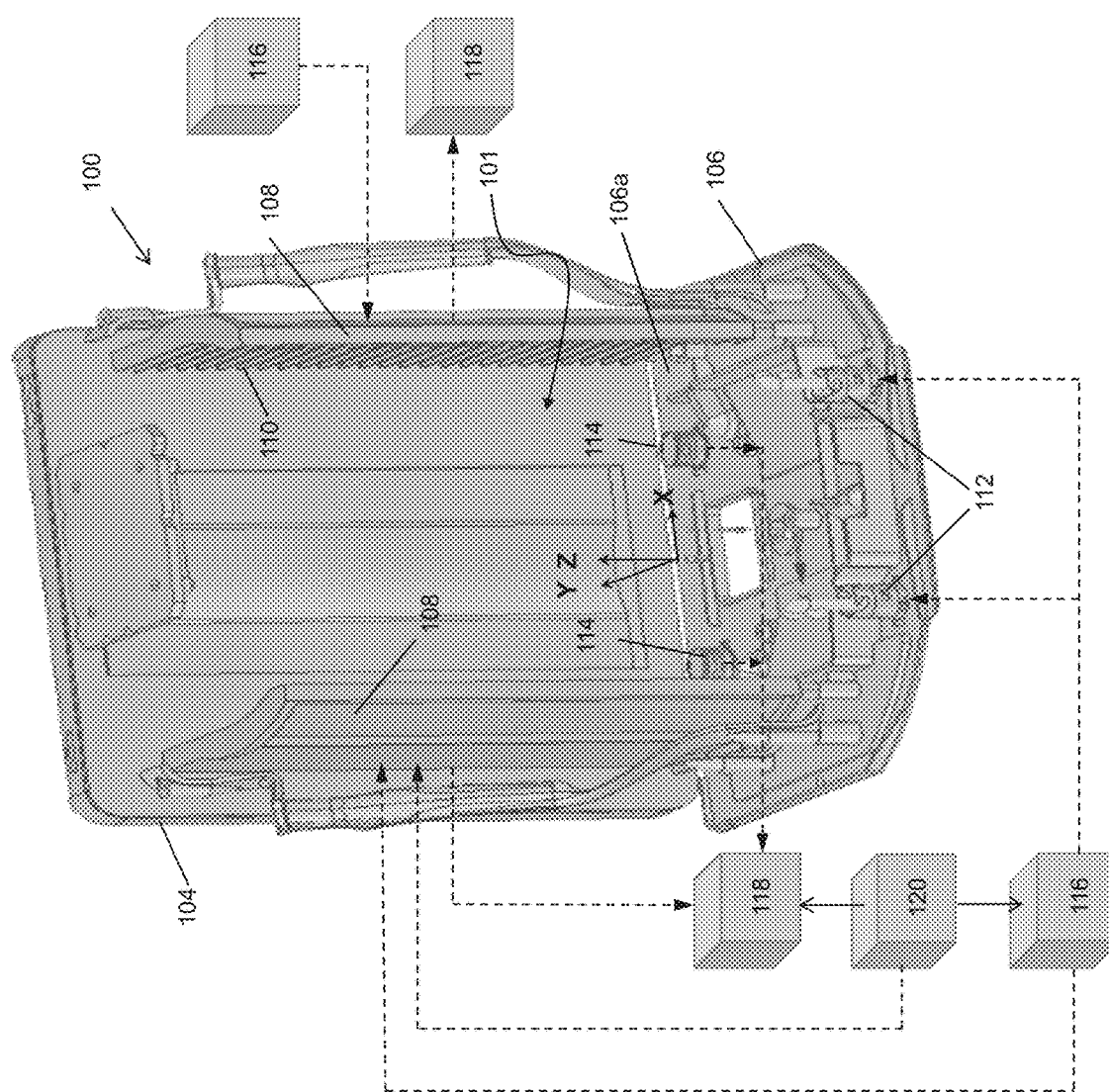
FIGS. 1A-1B illustrate isometric views of a storage device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. In some embodiments, based on the particular technology node, the term "about" can indicate a value of a given quantity that varies within, for example, 5-30% of the value (e.g., ±5%, ±10%, ±20%, or 30% of the value).

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

Semiconductor wafers are subjected to different processes (e.g., wet etching, dry etching, ashing, stripping, metal plating, and/or chemical mechanical polishing) in different processing chambers during the fabrication of semiconductor devices. The wafers are typically transported and temporarily stored in batches in wafer storage devices during intervals between the different processes. The wafers of each batch are stacked vertically in the wafer storage devices and supported by support frames having multiple separate wafer shelves or slots in the storage devices. These storage devices, usually referred to as front-opening unified pods (FOUPs), need to provide a humidity- and contamination-controlled environment to maintain the integrity of the wafers and/or the fabricated layers on the wafers.

Moisture in the storage devices from surrounding atmosphere can react with residual materials on the wafers from the different wafer processes and form defects in the fabricated layers on the wafers that can result in defective semiconductor devices, and hence, loss in production yield. For example, the wafers subjected to an etching process using tetrafluoromethane ($CF_4$) as the etchant can have cryptohalite (($NH_4)_2SiF_6$) as the residual material. Cryptohalite can react with moisture in the form of water vapor to produce ammonia ($NH_3$) and hydrofluoric acid (HF), which can remove portions of the fabricated layer materials from the wafers and form defects in the fabricated layers.

Besides moisture, particles in the storage device can also result in defective wafers. During transport of the storage device, vibration can cause the wafers to locally displace from their respective wafer slots. Such local displacements of the wafers can raise particles in the storage device, where the raised particles can randomly fall on surfaces of the wafers. This can cause semiconductor device defects and hence jeopardize an overall yield of the product manufacturing.

The present disclosure provides examples of storage devices configured to bind the wafers to respective wafer slots to achieve and maintain wafer stability during transport of the storage device. In some embodiments, the storage device can include a protrusion and a binding device configured to bind the wafer to the protrusion. The binding device can be a padding layer attached to the protrusion, where the padding layer can have at least one opening configured to provide a vacuum to hold the wafer over the protrusion. In some embodiments, the binding device can be a clip configured to clamp the wafer over the protrusion. An advantage of such storage device is to prevent displacement of the wafer during transport of the storage device, and therefore minimize inducing the respective particle contamination on surfaces of the wafers. As a result, the storage device can improve overall production yield due to a decrease in defective wafers.

Figure 1B:
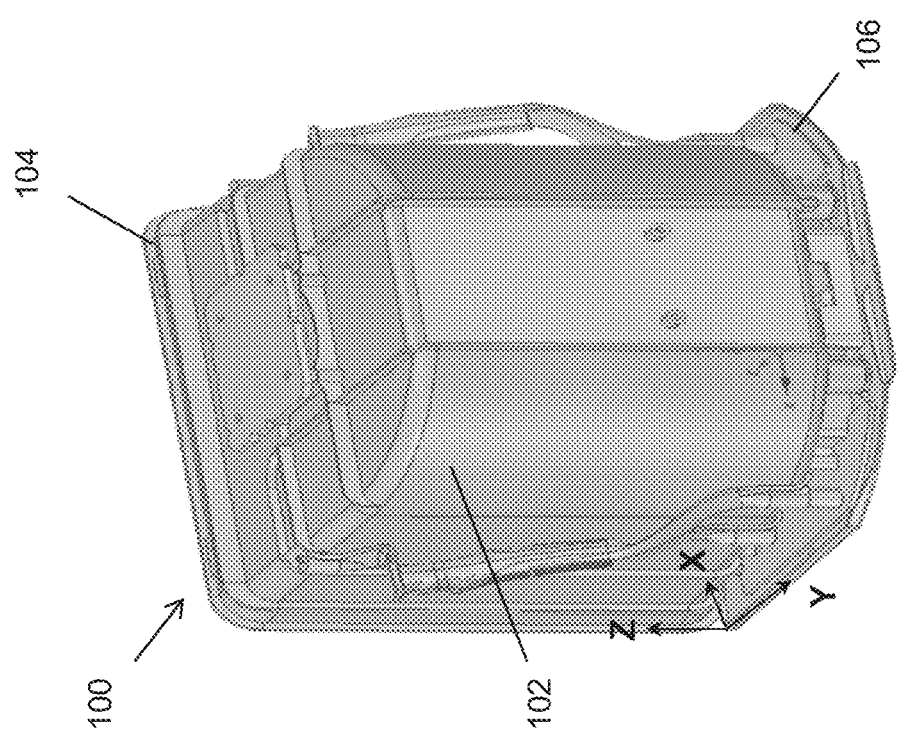

FIGS. 1A and 1B illustrate isometric views of a storage device 100 without and with a back cover 102, respectively, according to some embodiments. Storage device 100 can be configured to transport and temporarily store a batch of substrates (not shown) that may be waiting to be processed for manufacturing semiconductor devices on them. Storage device 100 can be configured to maintain a desired relative humidity (e.g., equal to or less than about 13%) and/or contaminant-level throughout the interior volume of storage device 100 to protect the wafers and/or fabricated layers on the wafers from moisture and contaminants.

In some embodiments, storage device 100 can be transported from a first location to a second location of a fabrication facility via a transport mechanism (e.g., a vehicle). The transport mechanism can store an indoor map of the fabrication facility and can include suitable positioning systems configured to move the transport mechanism in the fabrication facility following designated routes. For example, the transport mechanism can include a global positioning system (GPS) receiver, a receiving device/program with a Bluetooth-based indoor positioning system, and/or a receiving device/program with a WiFi-based indoor positioning system for navigating the transport mechanism in the fabrication facility according to the indoor map.

Storage device 100 can include a back cover 102, a front panel 104, a base panel 106, and side panels 108 having horizontal fin structures (e.g., in the y-direction) 110 extending outwardly from inner surfaces of each of side panels 108 (illustrated only on one side panel). Fin structures 110 on each side panels 108 can be a single continuous fin structure or can have two or more segments of fin structure. A substrate in storage device 100 can be placed in a slot between two adjacent fin structures 110 (e.g., two adjacent fin structures 110 can be separated in z-direction shown in FIG. 1A), where the substrate can be in contact with one of two adjacent fin structures 110. Back cover 102, front panel 104, base panel 106, and side panels 108 can be coupled to one another to form an enclosed volume 101 that holds a batch of substrates (not shown in FIG. 1A). Front panel 104 can be opened during loading and unloading of the batch of substrates, but can remain closed during purging of storage device 100 to remove moisture and contaminants from inside storage device 100.

The batch of substrates can be stacked vertically (e.g., in the z-direction) in enclosed volume 101, and each substrate can be supported by one of horizontal fin structures 110 on each of side panels 108. Vertical spaces (e.g., slots) between adjacent fin structures 110 can be greater than the thickness of the substrate, such that each of the substrates can be stacked one on top of another. Each of horizontal fin structures 110 can be configured to support at least a portion of a substrate sufficiently to prevent warping or damage to the substrate. In some embodiments, horizontal fin structures 110 can be configured to support a peripheral edge portion on opposing sides of each substrate to minimize contact with layers fabricated on the substrates as the substrates are loaded into and unloaded from storage device 100.

Base panel 106 can include purge gas inlet and outlet ports 112 and 114, respectively. Even though two inlet ports 112 and two outlet ports 114 are shown, base panel 106 can have less than or more than two inlet and outlet ports similar to respective inlet and outlet ports 112 and 114. Purge gas inlet ports 112 can be configured to allow purge gas to be supplied in enclosed volume 101 to purge moisture and/or contaminants while the batch of substrates is in enclosed volume 101 of storage device 100. The purge gas can be extracted from enclosed volume 101 through purge gas outlet ports 114. In some embodiments, the purge gas can include an inert as, such as nitrogen, argon, neon, or a combination thereof.

In some embodiments, back cover 102, front panel 104, base panel 106, side panels 108, and horizontal fin structures 110 can include polymeric materials, such as transparent or opaque polycarbonate, polyvinyl chloride, or any other suitable material. In some embodiments, one or more portions of back cover 102 can have semi-permeable membranes. The semi-permeable membranes can have microscopic pores with a pore size of about 0.01 µm in diameter. In some embodiments, the diameter of the pores is in the range between 0.002 µm to 0.05 µm. In some embodiments, the diameter of the pores is in the range between 0.005 µm to 0.03 µm. In some embodiments, the diameter of the pores is in the range between 0.007 µm to 0.02 µm. The size of the microscopic pores in the semi-permeable membranes can be sized to block and prevent particulate contaminants from entering into storage device 100 and to allow corrosive gas molecules from in storage device 100 to diffuse out.

Referring to FIG. 1A, storage device 100 can further include a purge system with a purge gas supply system 116, a purge gas extraction system 118, and a control system 120. Purge gas supply system 116 can be configured to supply purge gas in enclosed volume 101 through purge gas inlet ports 112 during a purging operation of storage device 100. In some embodiments, purge gas supply system 116 can be connected to horizontal fin structures 110 through purge gas inlet port 112. The black dashed lines from purge gas supply system 116 to purge gas inlet port 112 illustrate the purge gas supply lines. Purge gas can be supplied into enclosed volume 101 when a batch of substrates is loaded and enclosed in storage device 100 to provide a humidity- and contamination-controlled environment.

In some embodiments, purge gas supply system 116 can be connected to horizontal fin structures 110 through another purge gas inlet port (not shown in FIG. 1A) similar to inlet port 112.

Referring to FIG. 1A, purge gas extraction system 118 can be coupled to purge gas outlet ports 114 and can be configured to extract the purge gas from in enclosed volume 101 through purge gas outlet ports 114. In some embodiments, purge gas extraction system 118 can be connected to horizontal fin structures 110 through purge gas outlet ports 114. The extraction of the purge gas can be performed by an extraction pump of purge gas extraction system 118. The black dashed lines from purge gas outlet ports 114 to purge gas extraction system 118 illustrate the purge gas extraction lines.

In some embodiments, purge gas extraction system 118 can be connected to horizontal fin structures 110 through another purge gas outlet port (not shown in FIG. 1A) similar to outlet port 118.

Control system 120 can be coupled to purge gas supply and extraction systems 116 and 118. In some embodiments, control system 120 can be configured to control the operations of purge gas supply and extraction systems 116 and 118. In some embodiments, control system 120 can simultaneously activate and/or deactivate purge gas supply and extraction systems 116 and 118. In some embodiments, control system 120 can provide a time delay between the activation of purge gas supply and extraction systems 116 and 118 and/or the deactivation of purge gas supply and extraction systems 116 and 118.

The activation and/or deactivation of purge gas supply and extraction systems 116 and 118 can include controlling the purge gas supply to purge gas inlet ports 112 and the operation of the extraction pump, respectively. In some embodiments, to activate and deactivate purge gas supply system 116, control system 120 can provide activation and deactivation signals that open and close a gas supply valve of purge gas supply system 116 to supply and block, respectively, the flow of purge gas to purge gas inlet port 112. In some embodiments, to activate and deactivate purge gas extraction system 118, control system 120 can provide activation and deactivation signals that activate and deactivate the extraction pump, and open and close a valve of purge gas extraction system 118 to allow and block, respectively, the flow of purge gas out of enclosed volume 101 through purge gas outlet ports 114.

The operations of purge gas supply and extraction systems 116 and 118 can be controlled by control system 120 based on one or more signals that indicate the presence of substrates in storage device 100, a motion status (e.g., in transport or stationary) of storage device 100, the position of front panel 104, the pressure of purge gas in enclosed volume 101, the duration of purging, the relative humidity in storage device 100, and/or the contamination level (e.g., corrosive gas level) in storage device 100. In some embodiments, control system 120 can provide activation signals to purge gas supply and extraction systems 116 and 118 (e.g., simultaneously or with a time delay) in response to receiving sensor signals that indicate the presence of substrates in storage device 100 and a closed position of front panel 104. Similarly, deactivation signals can be provided by control system 120 to purge gas supply and extraction systems 116 and 118 (e.g., simultaneously or with a time delay) in response to receiving sensor signals that indicate the absence of substrates in storage device 100 and the close position of front panel 104. In some embodiments, deactivation signals can be provided by control system 120 to purge gas supply and extraction systems 116 and 118 simultaneously in response to receiving a sensor signal that indicates an open position of front panel 104. These sensor signals can be provided by one or more sensors (not shown) positioned on or in storage device 100.

The activation and deactivation signals can be provided by control system 120 based on the duration of purging and/or relative humidity in enclosed volume 101. In some embodiments, control system 120 can schedule purge gas supply and extraction systems 116 and 118 to remain activated and/or deactivated for a desired time period when substrates are present in storage device 100. However, purge gas supply and extraction systems 116 and 118 can be activated from a scheduled or unscheduled deactivated state when substrates are present in response to control system 120 receiving a sensor signal from humidity and/or gas sensors indicating that the relative humidity and/or the contamination level, respectively, in enclosed volume 101 is above a desired value. Similarly, purge gas supply and extraction systems 116 and 118 can be deactivated from a scheduled or unscheduled activated state when substrates are present in response to control system 120 receiving a sensor signal from the humidity and/or gas sensors indicating that the relative humidity and/or the contamination level, respectively, in enclosed volume 101 is below the desired value.

The activation and deactivation signals can also be provided by control system 120 based on storage device 100 and the motion status of storage device 100. For example, control system 120 can provide deactivation signals to purge gas supply system 116 and activation signals to purge gas extraction system 118 in response to storage device 100 being in transit. Similarly, control system 120 can provide activation signals to purging gas supply system 116 and deactivation signals to purge gas extraction system 118 in response to storage device 100 arriving at a designated location and stationary.

In some embodiments, other independent purging gas supply and extraction systems (not shown in FIG. 1A), similar to purging gas supply and extraction systems 116 and 118, can be connected to fin structures 110. Control system 120 can be coupled and configured to control both independent purging gas supply and extraction systems similar to the discussion above.

In some embodiments, control system 120 can be configured to control fin structures 110 to bind or unbind the substrates based on the presence of substrates in storage device 100 and the motion status of storage device 100. For example, control system 120 can control a mechanical motion of fin structures 110 to bind substrates in response to the substrates being placed in storage device 100 or storage device 100 being in transport. Similarly, control system 120 can control the mechanical motion of fin structures 110 to unbind substrates in response to substrates being withdrawn from storage device 100, or storage device 100 arriving at a designated location and stationary.

FIG. 2A illustrates an isometric view of a fin structure 200 configured to hold a substrate (not shown in FIG. 2A) in storage device 100 via a vacuum suction, according to some embodiments. Fin structure 200 can be an embodiment of fin structure 110 disposed on side panel 108, where the substrate can be placed between two adjacent fin structures 200 (e.g., two adjacent fin structures separated vertically in z-direction shown in FIG. 2A). Fin structure 200 can include a protrusion 202 configured to support the substrate, and a padding layer 204 configured to provide the vacuum suction to bind the substrate over protrusion 202. Protrusion 202 can be disposed at inner surfaces of side panels 108 and extend inwardly towards enclosed volume 101. Padding layer 204 can be disposed over protrusion 202, where padding layer 204 can be located between protrusion 202 and the substrate. For example, padding layer 204 can be attached to protrusion 202 via an adhesive, a tape, or a mechanical part (e.g., a clamp), and the substrate can be placed over padding layer 204. A top surface of padding layer 204 can have an opening 206 configured to be covered by the substrate. Padding layer 204 can further include a gas pipe 208 interconnected to opening 206. In some embodiments, padding layer 204 can have multiple openings 206 and multiple gas pipes 208, while each or several of the multiple openings 206 can be interconnected to each or several of the multiple gas pipes 208.

In some embodiments, each side panels 108 of storage device 100 can have a respective fin structure 200, where the respective protrusions 202 of each of fin structures 200 can be a continuous protrusion or have two or more segments of protrusions.

In some embodiments, each of side panels 108 of storage device 100 can have a respective fin structure 200, where the respective padding layers 204 of each of fin structures 200 can be a continuous padding layer or have two or more segments of padding layers.

In some embodiments, protrusion 202 can be made of polymeric materials, such as transparent or opaque polycarbonate, polyvinyl chloride, or other suitable material.

In some embodiments, padding layer 204 can be made of a membrane, a plastic sheet, a tape, a polymer film, or other suitable material. In some embodiments, a thickness of padding layer 204 can be between about 0.5 mm and about 2.5 mm.

In some embodiments, a diameter of opening 206 can be between about 0.5 mm and about 2.0 mm.

In some embodiments, a diameter of gas pipe 208 can be between about 0.5 mm and about 2.0 mm.

FIG. 2B illustrates a cross sectional view of fin structure 200 along line A-A' shown in FIG. 2A, according to some embodiments. As shown in FIG. 2B, padding layer 204 can have a bottom surface 222 configured to attach to a portion of protrusion 202, a top surface 224 opposite to bottom surface 222, and a side surface 226 between bottom surface 222 and top surface 224. Opening 206 can be disposed at top surface 224, where a substrate 210 in storage device 100 can be in contact with top surface 224 and covering opening 206. Gas pipe 208 can be disposed at side surface 226 and interconnected to opening 206. Gas pipe 208 can be further connected to the previously described purging gas supply and/or extraction systems (e.g., purge gas supply and extraction systems 116 and 118) to regulate the vacuum suction through opening 206 to bind/unbind substrate 210 with/from protrusion 202. For example, the vacuum suction can bind substrate 210 over protrusion 202, through gas pipe 208 and opening 206, by activating the purging gas extraction system. Such binding provided by the vacuum suction through padding layer 204 can prevent displacement or vibration of substrate 210 in storage device 100. In some embodiments, the vacuum suction can be corresponded to a pressure difference between about 0.5 standard atmosphere and about 0.8 standard atmosphere. The vacuum suction can be released to unbind substrate 210 from protrusion 202 by either deactivating the purging gas extraction system or activating the purging gas supply system. In some embodiments, gas pipe 208 can be connected to an exhaust shaft (not shown in FIG. 2B) configured to provide or disable the vacuum suction to hold or release substrate 210.

FIG. 3A illustrates an isometric view of a fin structure 300, according to some embodiments. The discussion of fin structure 200 applies to fin structure 300 unless mentioned otherwise. Fin structure 300 can include protrusion 202 and a padding layer 304 configured to bind the substrate over protrusion 202. Padding layer 304 can be disposed over protrusion 202 and can further include gas pipe 208, where an outer surface 324 of padding layer 304 can have at least one opening 206 interconnected to gas pipe 208. The description of elements in FIGS. 2A-2B applies to elements with the same annotations in FIG. 3A unless mentioned otherwise.

FIG. 3B illustrates a cross sectional view of fin structure 300 along line B-B' shown in FIG. 3A, according to some embodiments. As shown in FIG. 3B, padding layer 304 can be configured to encapsulate or cap protrusion 202. For example, padding layer 304 can have an inner surface 322 opposite to outer surface 324, in which inner surface 322 can contact and enclose protrusion 202. Padding layer 304 can encapsulate protrusion 202 via an adhesive, a tape, or a mechanical part (e.g., a clamp). Padding layer 304 can be made of the same or similar material as padding layer 204. In some embodiments, padding layer 304 can be made of an elastic material (e.g., a rubber), where padding layer 304 can encapsulate or cap protrusion 202 via an elasticity associated with the elastic material.

Figure 4:
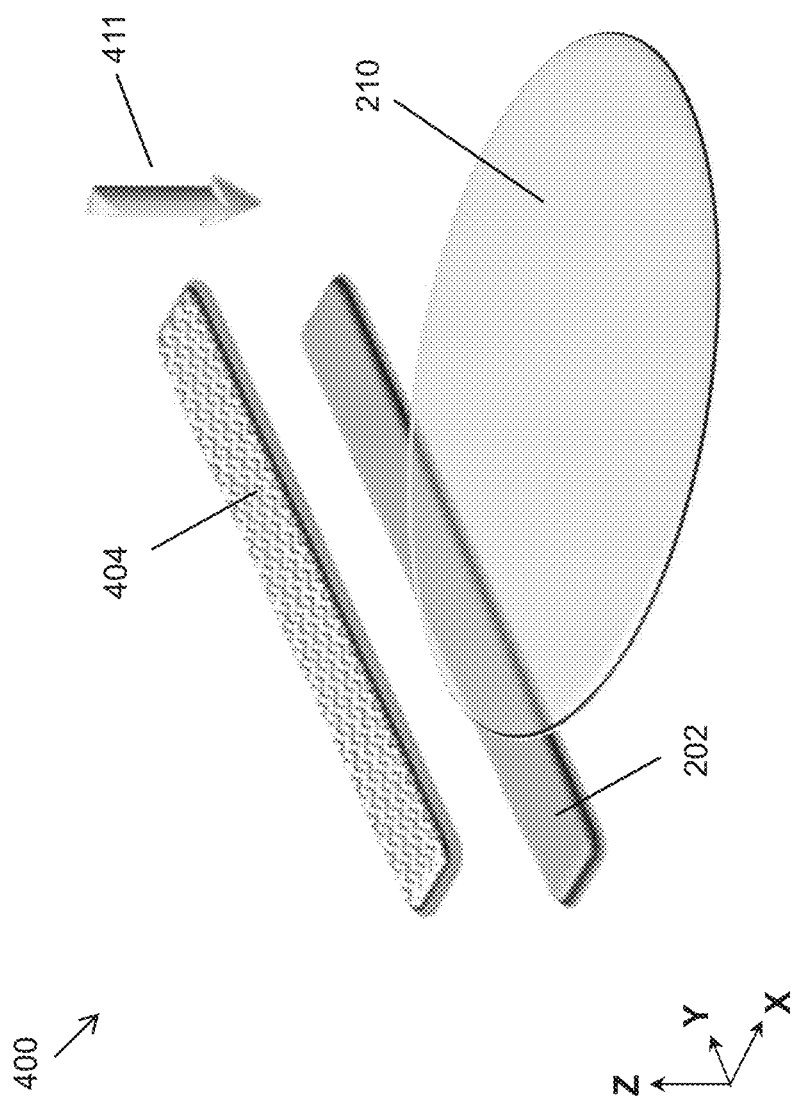
FIG. 4 illustrates an isometric view of a fin structure of a storage device, in accordance with some embodiments.

FIG. 4 illustrates an isometric view of a fin structure 400 configured to hold a substrate in storage device 100 via pressure retention, according to some embodiments. Fin structure 400 can be an embodiment of fin structure 110 of FIG. 1A, where the substrate (e.g., substrate 210) can be placed between two adjacent fin structures 400 (e.g., two adjacent fin structures 400 separated in z-direction shown in FIG. 4). Fin structure 400 can include protrusion 202 and a clip 404 configured to provide the pressure retention to bind a portion of substrate 210 over protrusion 202. Clip 404 can be disposed over protrusion 202, where substrate 210 can be placed between protrusion 202 and dip 404. Clip 404 can be connected to control system 120, where control system 120 can control a movement of clip 404. For example, in response that substrate 210 is placed over protrusion 202, control system 120 can control dip 404 to move downward (e.g., direction 411) to provide the pressure retention to clamp and bind substrate 210 onto protrusion 202. Such pressure retention provided by clip 404 can prevent displacement or vibration of substrate 210 in storage device 100. Control system 120 can also control clip 404 to move upward (e.g., opposite to direction 411) to release the pressure retention to unbind substrate 210 from protrusion 202. In some embodiments, clip 404 can be mechanically coupled to a shaft (not shown in FIG. 4), where the shaft can control the movement of clip 404 to bind/unbind substrate 210 with/from protrusion 202. In some embodiments, clip 404 can be mechanically coupled to any mechanical components to control the movement of clip 404.

In some embodiments, fin structures 400 can further include padding layer 204 (not shown in FIG. 4) disposed over protrusion 202 to regulate the vacuum suction to bind/unbind the substrate.

In some embodiments, clip 404 can be made of similar material as protrusion 202. Clip 404 can be a single continuous pad, where a size of clip 404 can be similar to or smaller than that of protrusion 202. Clip 404 can include segments of pads (not shown in FIG. 4), where each segment can have a similar or smaller size than that of protrusion 202.

In some embodiments, each side panels 108 of storage device 100 can have a respective fin structure 400, where the respective protrusions 202 and clips 404 of each fin structure 400 can be a continuous protrusion or have two or more segments of protrusions 202 and clips 404, respectively. In some embodiments, each of side panels 108 can include fin structure 200 or fin structure 400, where the respective protrusions 202 of each fin structure 200 or fin structure 400 can be a continuous protrusion or have two or more segments of protrusions.

Figure 5:
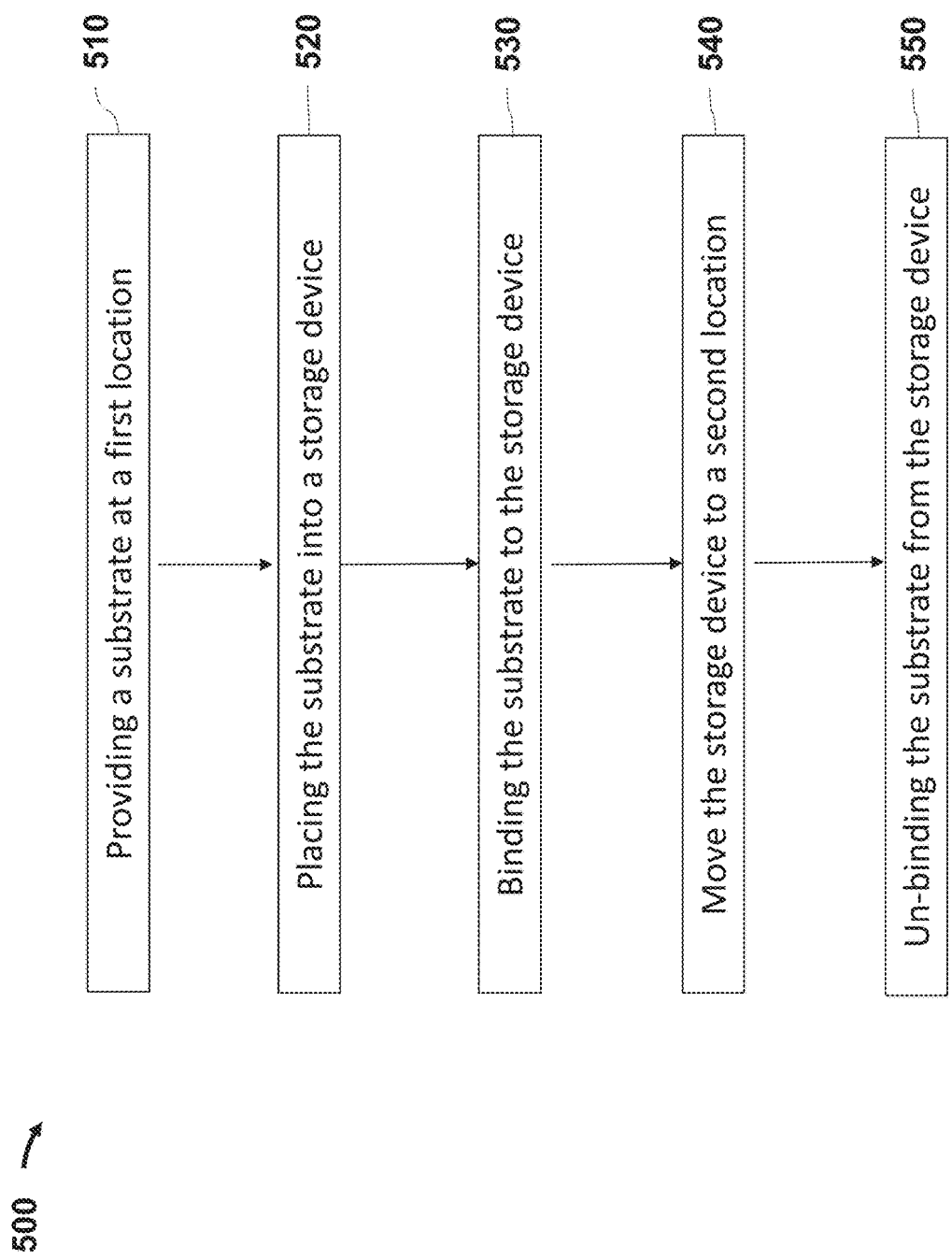
FIG. 5 illustrates a method for operating a storage device, according to some embodiments.

FIG. 5 is an exemplary method 500 for operating a storage device, where the storage device configured to bind and/or unbind substrates, according to some embodiments. This disclosure is not limited to this operational description. It is to be appreciated that additional operations may be performed. Moreover, not all operations may be needed to perform the disclosure provided herein. Further, some of the operations may be performed simultaneously, or in a different order than shown in FIG. 5. In some implementations, one or more other operations may be performed in addition to or in place of the disclosed operations. For illustrative purposes, method 500 is described with reference to the embodiments of FIGS. 1-4. However, method 500 is not limited to these embodiments.

Exemplary method 500 begins with operation 510, where a substrate is provided at a first location. The substrate can include any suitable material for forming semiconductor device structures. For example, the substrate can include silicon, silicon germanium, silicon carbide, SOI, GOI, glass, quartz, gallium nitride, gallium arsenide, plastic sheet and/or other suitable I-V compound. The first location can be any place in a fabrication facility and can be where the substrate is originally located. For example, the first location can be a warehouse which provides the substrate. The substrate can also be a semi-finished product from a semiconductor device fabrication process station. For example, the first location can be any place where a semiconductor device fabrication station (e.g., a lithography station) is located. The semiconductor device fabrication station can provide the substrate which has gone through its respective fabrication processing steps.

In operation 520, the substrate is placed into a storage device. The storage device can include multiple side panels and multiple fin structures disposed at inner surfaces of each side panels. The substrate can be deposited into a slot between two adjacent fin structures of the multiple fin structures. Referring to FIG. 1, for example, the multiple fin structures 110 can be disposed at inner surface of each side panels 108, where each fin structures 110 can be separated from each other vertically in the z-direction. The substrate can be horizontally (e.g. the substrate's top surface is parallel to the x-y plane) placed in a slot between two adjacent fin structures 110. In some embodiments, the substrate can be placed into the storage device via a robotic transferring arm of a semiconductor fabrication apparatus. In some embodiments, the substrate can be manually placed into the storage device. In some embodiments, multiple substrates can be placed into the respective slots of the storage device simultaneously or separately.

In operation 530, the substrate is bound to the storage device. After placing the substrate into the storage device, the substrate can be in contact with fin structures. The substrate can be further bound to the fin structures via a vacuum suction provided by a binding device. Referring to FIGS. 2A-2B, for example, the binding device can be padding layer 204 with at least one opening 206 at its top surface, where the substrate can be placed over padding layer 204 to cover opening 206. A vacuum can be applied through gas pipe 208 and opening 206 to provide the vacuum suction hold the substrate over padding layer 204 and thus bind the substrate to the storage device. In some embodiments, multiple substrates, placed in the respective slots, can be simultaneously bound to the storage device via the vacuum suction.

In some embodiments, the substrate can be bound to the one of the two adjacent fin structures via a pressure retention provided by the binding device. Referring to FIG. 4, for example, the binding device can be clip 404, where the substrate can be placed between protrusion 202 and clip 404. Clip 404 can be moved towards protrusion 202 and provide the pressure retention to clamp the substrate over protrusion 202 and therefore bind the substrate to the storage device. In some embodiments, multiple substrates, deposited in the respective slots, can be simultaneously bound to the storage device via the respective pressure retention provided by respective dips 404.

In some embodiments, a first group of substrates placed in the respective slots can be bound to the storage device via the vacuum suction, while a second group of substrates placed in another respective slots can be bound to the storage device via pressure retention. In some embodiments, a substrate placed in the storage device can be bound to the storage device via both the vacuum suction and the pressure retention.

In operation 540, the storage device is moved to a second location of the fabrication facility. The storage device can be transferred to a transport mechanism at the first location of the fabrication facility. The transport mechanism can then move to the second location based on an indoor map (stored in the transport mechanism). In some embodiments, the transport mechanism can include a vehicle or a robotic arm. In some embodiments, the storage device can be moved to the second location via a manually-controlled transport mechanism. In some embodiments, the second location can be the same as the first location, such that the substrate remains stored in the storage device at the first location (e.g., storage device remains still). Additional details of operation 540 are above with respect to the description of FIGS. 1A-1B.

In operation 550, the substrate is unbound from the storage device. After the storage device reaches the second location, the binding device can release the substrate from attaching to the fin structures. In some embodiments, the releasing of the substrate can include deactivating the vacuum suction or pressure retention provided by the binding device. The released substrate can be subsequently withdrawn from the slot of the storage device and be delivered to a warehouse or another semiconductor device fabrication station to continue the respective fabrication process. Additional details of operation 550 are above with respect to the description of FIGS. 2A-4.

The present disclosure provides a storage device and a method for storing substrates that employs binding devices to bind the substrates. According to some embodiments, the storage device can have multiple side panels and multiple fin structures at inner surfaces of the side panels. Each of the fin structures can include a protrusion and a binding device associated with the protrusion. In some embodiments, the binding device can be a padding layer attached to the protrusion, where a top surface of the padding layer can have at least one opening. The substrate can be placed and adhere to the padding layer via a vacuum suction through the opening. In some embodiments, the binding device can be a clip, where the substrate can be clamped on the protrusion with the clip. Such storage device with binding devices can prevent displacement or vibrations of the substrate during transport of the storage device, thus reducing the respective particle contamination, decreasing defective substrates, and improving overall production yield of device manufacturing.

In some embodiments, a storage device can include a first and a second multiples of panels configured to form an enclosed volume, and fin structures disposed at inner surfaces of the second multiples of panels. Each of the fin structures, configured to hold a substrate, can include a protrusion extending inwardly into the enclosed volume, and a binding device disposed over the protrusion, where the binding device can be configured to bind the substrate over the protrusion.

In some embodiments, a storage device can include a panel, and a fin structure configured to hold a wafer and disposed on a side surface of the panel. The fin structure can include a protrusion extending outwardly from the side surface of the panel, and a padding layer attached to the fin structure, where the padding layer can include one or more openings configured to provide a vacuum to bind the wafer over the protrusion.

In some embodiments, a method for substrate storage can include providing one or more substrates at a first location, placing the one or more substrates into a storage device where the storage device can include multiple fin structures, and binding the one or more substrates to the storage device via binding devices associated with each of the multiple fin structures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   placing a substrate within a storage device, wherein the substrate is placed within a slot between two adjacent fin structures of a plurality of fin structures wherein, the plurality of fin structures are disposed on a side surface of a panel of the storage device; and
   binding the substrate to one of the two adjacent fin structures by providing a vacuum suction via one or more openings in a padding laver associated with each of the plurality of fin structures.

2. The method of claim 1, further comprising un-binding the substrate from the one of the two adjacent fin structures.

3. The method of claim 1, wherein binding the substrate to one of the two adjacent fin structures comprises applying a vacuum via an opening in a padding layer associated with the one of the two adjacent fin structures.

4. The method of claim 1, further comprising activating a gas extraction system to provide a vacuum to bind the substrate to the one of the two adjacent fin structures.

5. The method of claim 1, further comprising supporting a peripheral edge portion of the substrate with the plurality of fin structures.

6. The method of claim 1, further comprising binding the substrate to one of the two adjacent fin structures by applying vacuum through a gas pipe.

7. A method, comprising:
   placing a plurality of substrates in a plurality of slots formed by a plurality of fin structures, wherein a slot is formed between two adjacent vertically spaced fin structures; and
   binding each of the plurality of substrates to a corresponding one of the plurality of fin structures by applying a vacuum suction via one or more openings in padding layer associated with the corresponding one of the plurality of fin structures.

8. The method of claim 7, wherein binding each of the plurality of substrates comprises activating a gas extraction system to provide a vacuum suction via a padding layer associated with each of the plurality of fin structures.

9. The method of claim 8, further comprising providing the vacuum suction to the one or more openings through a gas pipe.

10. The method of claim 8, further comprising releasing the plurality of substrates from the plurality of fin structures by deactivating the vacuum suction.

11. The method of claim 7, further comprising placing at least a portion of a substrate of the plurality of substrates on the plurality of fin structures.

12. The method of claim 7, further comprising:
    binding one or more of the plurality of substrates to a plurality of slots using a vacuum suction.

13. The method of claim 7, wherein binding each of the plurality of substrates to the corresponding one of the plurality of fin structures comprises:
    placing each of the plurality of substrates in contact with a top surface of the padding layer; and
    covering the one or mom openings in the padding layer.

14. A method, comprising:
    depositing one or more substrates into respective one or more slots between two adjacent protrusions of a plurality of protrusions;
    supporting a peripheral edge of a substrate of the one or more substrates between the one or more slots;
    binding the one or more substrates to a binding device covering the plurality of protrusions, wherein the binding device provides a vacuum suction via one or more openings in padding layer associated with each of the plurality of protrusions; and
    releasing the one or more substrates from the binding device.

15. The method of claim 14, wherein binding the one or more substrates comprises applying a vacuum suction through an opening in a top surface of the binding device.

16. The method of claim 14, wherein binding and releasing the one or more substrates comprises regulating a vacuum suction.

17. The method of claim 14, further comprising activating a gas extraction system to provide a vacuum to bind the one or more substrates to the binding device.

18. The method of claim 14, further comprising vacuum binding the one or more substrates to the binding device.

19. The method of claim 14, further comprising deactivating a gas extraction system to release a vacuum to release the substrate from the plurality of protrusions.

20. The method of claim 14, wherein binding the one or more substrates comprises applying a vacuum through a gas pipe connected to the binding device.

* * * * *

UNITED STATES PATENT AND TRADEMARK OFFICE
CERTIFICATE OF CORRECTION

PATENT NO. : 11,764,089 B2
APPLICATION NO. : 17/228337
DATED : September 19, 2023
INVENTOR(S) : Chen et al.

It is certified that error appears in the above-identified patent and that said Letters Patent is hereby corrected as shown below:

On the Title Page

Item (57), under "ABSTRACT", Line 6, delete "an" and insert -- a --, therefor.

In the Claims

In Column 11, Claim 1, Line 54, delete "laver" and insert -- layer --, therefor.

In Column 12, Claim 7, Line 12, after "in", insert -- a --.

In Column 12, Claim 13, Line 36, delete "mom" and insert -- more --, therefor.

In Column 12, Claim 14, Line 46, after "in", insert -- a --.

Signed and Sealed this
Twelfth Day of March, 2024

Katherine Kelly Vidal
*Director of the United States Patent and Trademark Office*